(12) United States Patent
Cheng et al.

(10) Patent No.: US 10,896,845 B2
(45) Date of Patent: Jan. 19, 2021

(54) AIRGAP VERTICAL TRANSISTOR WITHOUT STRUCTURAL COLLAPSE

(71) Applicant: International Business Machines Corporation, Armonk, NY (US)

(72) Inventors: Kangguo Cheng, Schenectady, NY (US); Chanro Park, Clifton Park, NY (US); Juntao Li, Cohoes, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/439,880

(22) Filed: Jun. 13, 2019

(65) Prior Publication Data

US 2020/0395238 A1  Dec. 17, 2020

(51) Int. Cl.

| | |
|---|---|
| *H01L 21/768* | (2006.01) |
| *H01L 27/088* | (2006.01) |
| *H01L 29/06* | (2006.01) |
| *H01L 29/78* | (2006.01) |
| *H01L 21/764* | (2006.01) |
| *H01L 21/762* | (2006.01) |
| *H01L 21/311* | (2006.01) |

(Continued)

(52) U.S. Cl.
CPC ........ *H01L 21/7682* (2013.01); *H01L 21/764* (2013.01); *H01L 21/76264* (2013.01); *H01L 21/76802* (2013.01); *H01L 27/088* (2013.01); *H01L 29/0649* (2013.01); *H01L 29/0653* (2013.01); *H01L 29/7827* (2013.01); *H01L 21/31116* (2013.01); *H01L 21/823487* (2013.01); *H01L 21/823885* (2013.01); *H01L 2221/1047* (2013.01)

(58) Field of Classification Search
CPC ............... H01L 21/7682; H01L 21/764; H01L 29/0649; H01L 21/76264; H01L 21/31116; H01L 21/76802; H01L 29/0653; H01L 27/088; H01L 29/7827; H01L 21/823885; H01L 21/823487; H01L 2221/1047
See application file for complete search history.

(56) References Cited

U.S. PATENT DOCUMENTS

6,316,309 B1 * 11/2001 Holmes ............. H01L 27/10864
257/E21.652
9,312,382 B2    4/2016 Gogoi
(Continued)

*Primary Examiner* — Yasser A Abdelaziez
(74) *Attorney, Agent, or Firm* — Cantor Colburn LLP; Randall Bluestone (57) ABSTRACT

Embodiments of the present invention are directed to forming an airgap-based vertical field effect transistor (VFET) without structural collapse. A dielectric collar anchors the structure while forming the airgaps. In a non-limiting embodiment of the invention, a vertical transistor is formed over a substrate. The vertical transistor can include a fin, a top spacer, a top source/drain (S/D) on the fin, and a contact on the top S/D. A dielectric layer is recessed below a top surface of the top spacer and a dielectric collar is formed on the recessed surface of the dielectric layer. Portions of the dielectric layer are removed to form a first cavity and a second cavity. A first airgap is formed in the first cavity and a second airgap is formed in the second cavity. The dielectric collar anchors the top S/D to the top spacer while forming the first airgap and the second airgap.

15 Claims, 8 Drawing Sheets

(51) Int. Cl.
*H01L 21/8234* (2006.01)
*H01L 21/8238* (2006.01)

(56) References Cited

U.S. PATENT DOCUMENTS

| | | |
|---|---|---|
| 9,368,572 B1 | 6/2016 | Cheng et al. |
| 9,443,982 B1 | 9/2016 | Balakrishnan et al. |
| 9,570,357 B2 | 2/2017 | Anderson et al. |
| 9,691,850 B2 | 6/2017 | Cheng et al. |
| 9,859,166 B1 | 1/2018 | Cheng et al. |
| 9,929,246 B1 | 3/2018 | Cheng et al. |
| 10,164,104 B2 | 12/2018 | Zhang et al. |
| 10,170,588 B1 | 1/2019 | Yamashita et al. |
| 10,395,988 B1* | 8/2019 | Cheng ............... H01L 29/66545 |
| 2010/0207245 A1* | 8/2010 | Cheng ............... H01L 27/10861 |
| | | 257/532 |
| 2017/0330965 A1 | 11/2017 | Basker et al. |
| 2020/0119190 A1* | 4/2020 | Cheng ............... H01L 29/7827 |

\* cited by examiner

AIRGAP VERTICAL TRANSISTOR WITHOUT STRUCTURAL COLLAPSE

BACKGROUND

The present invention generally relates to fabrication methods and resulting structures for semiconductor devices, and more specifically, to forming an airgap-based vertical field effect transistor (VFET) without structural collapse.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, VFETs employ semiconductor fins and side-gates can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for forming an airgap-based VFET without structural collapse. A non-limiting example of the method includes forming a vertical transistor over a substrate. The vertical transistor can include a fin, a top spacer, a top source/drain (S/D) on the fin, and a contact on the top S/D. A dielectric layer is recessed below a top surface of the top spacer and a dielectric collar is formed on the recessed surface of the dielectric layer. Portions of the dielectric layer are removed to form a first cavity and a second cavity. A first airgap is formed in the first cavity and a second airgap is formed in the second cavity. The dielectric collar anchors the top S/D to the top spacer while forming the first airgap and the second airgap, preventing structural collapse.

Embodiments of the invention are directed to a method for forming an airgap-based VFET without structural collapse. A non-limiting example of the method includes forming a vertical transistor over a substrate. A directional dielectric recess partially removes an interlayer dielectric (ILD) below a top spacer of the vertical transistor. A dielectric collar is formed on a recessed surface of the ILD and one or more airgaps are formed in the vertical transistor. The dielectric collar anchors portions of the vertical transistor while forming the one or more airgaps.

Embodiments of the invention are directed to a semiconductor structure. A non-limiting example of the semiconductor device includes a semiconductor fin over a substrate. A gate is formed over a channel region of the semiconductor fin and a top spacer is formed on the gate. A top S/D is formed on the semiconductor fin. The structure can include one or more airgaps. A dielectric collar anchors the top S/D to the top spacer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1A:
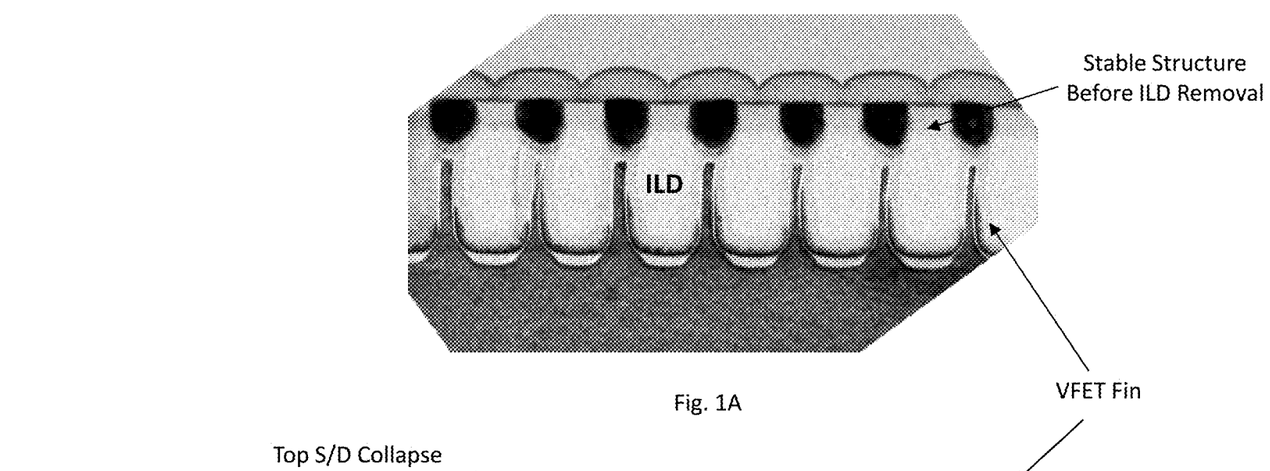
FIG. 1A depicts a semiconductor structure prior to structural collapse following the formation of airgaps.
Figure 1B:
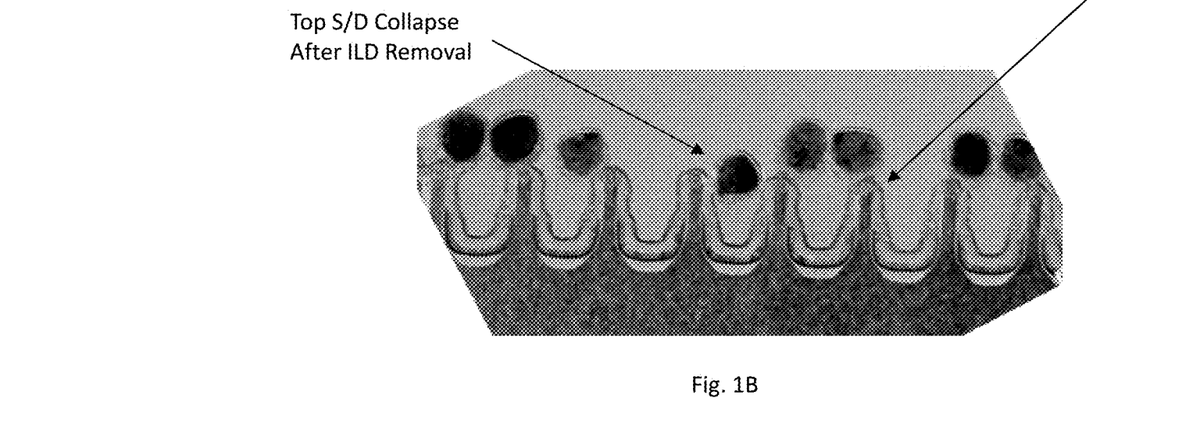
FIG. 1B depicts the semiconductor structure shown in FIG. 1A after structural collapse following the formation of airgaps.

Turning now to an overview of technologies that are more specifically relevant to aspects of the present invention, as next generation non-planar transistor technologies such as the VFET continue to scale, a critical scaling issue is the increase in parasitic capacitance between conducting elements (e.g., gate, contacts, etc.) as the dimensions and spacings of these elements shrink. The introduction of airgaps has been proven to be an effective approach in some transistor architectures (e.g., FinFETs) to reduce parasitic capacitance due to the extremely low dielectric constant (k) of air of about 1 (as compared to, e.g., silicon oxide having a k of about 3.9). Accordingly, replacing relatively higher k dielectric materials such as a silicon oxide interlevel dielectric (ILD) with an airgap can be greatly reduce parasitic capacitance. It has been found, however, that structural collapse can occur when attempting to form an airgap in a VFET. Specifically, the top source/drain (S/D) collapses into the dielectric region between fins due to the relatively large size of the VFET S/D that is formed over the relatively narrow VFET fin. FIGS. 1A and 1B depict a VFET structure prior to (FIG. 1A) and after (FIG. 1B) this collapse. The structural collapse typically occurs when removing, patterning, or otherwise modifying the dielectric region (e.g., an ILD) to insert an airgap.

Turning now to an overview of aspects of the present invention, one or more embodiments of the invention address the above-described shortcomings of the prior art by providing a new VFET semiconductor structure and a method for forming an airgap-based VFET that reduces parasitic capacitance while avoiding the structural collapse issue by using a two-step dielectric recess and a dielectric collar. The first dielectric recess is performed by a directional etch (e.g., by RIE), partially etching into the dielectric layer (e.g., ILD). A dielectric collar is then formed on the recessed dielectric layer to glue the relatively large top S/D (and the top contact) to the underlying structure (the top spacer, gate, and fin). A second dielectric etch is performed by isotropic etch to remove most of the dielectric layer between the top contact and the top spacer and between opposite sidewalls of the dielectric collar. A non-conformal dielectric deposition is used to form a first airgap between the top contact and the top spacer, and a second airgap between the opposite sidewalls of the dielectric collar. Advantageously, forming the airgaps in this manner can be done without inducing a collapse of the semiconductor structure.

Turning now to a more detailed description of aspects of the present invention, FIGS. 2-6 depict cross-sectional views of a semiconductor structure 200 after fabrication operations have been performed in accordance with embodiments of the invention to form a final semiconductor device. In embodiments of the invention, the final semiconductor device can be a variety of types of MOSFETs, including, for example, non-planar n-type field effect transistors (NFET) and p-type field effect transistors (PFET). For example, the final semiconductor device can be an n-type VFET or a p-type VFET. In the embodiment shown in FIG. 2, the semiconductor structure 200 includes one or more fins 202 formed over a substrate 204.

Figure 2:
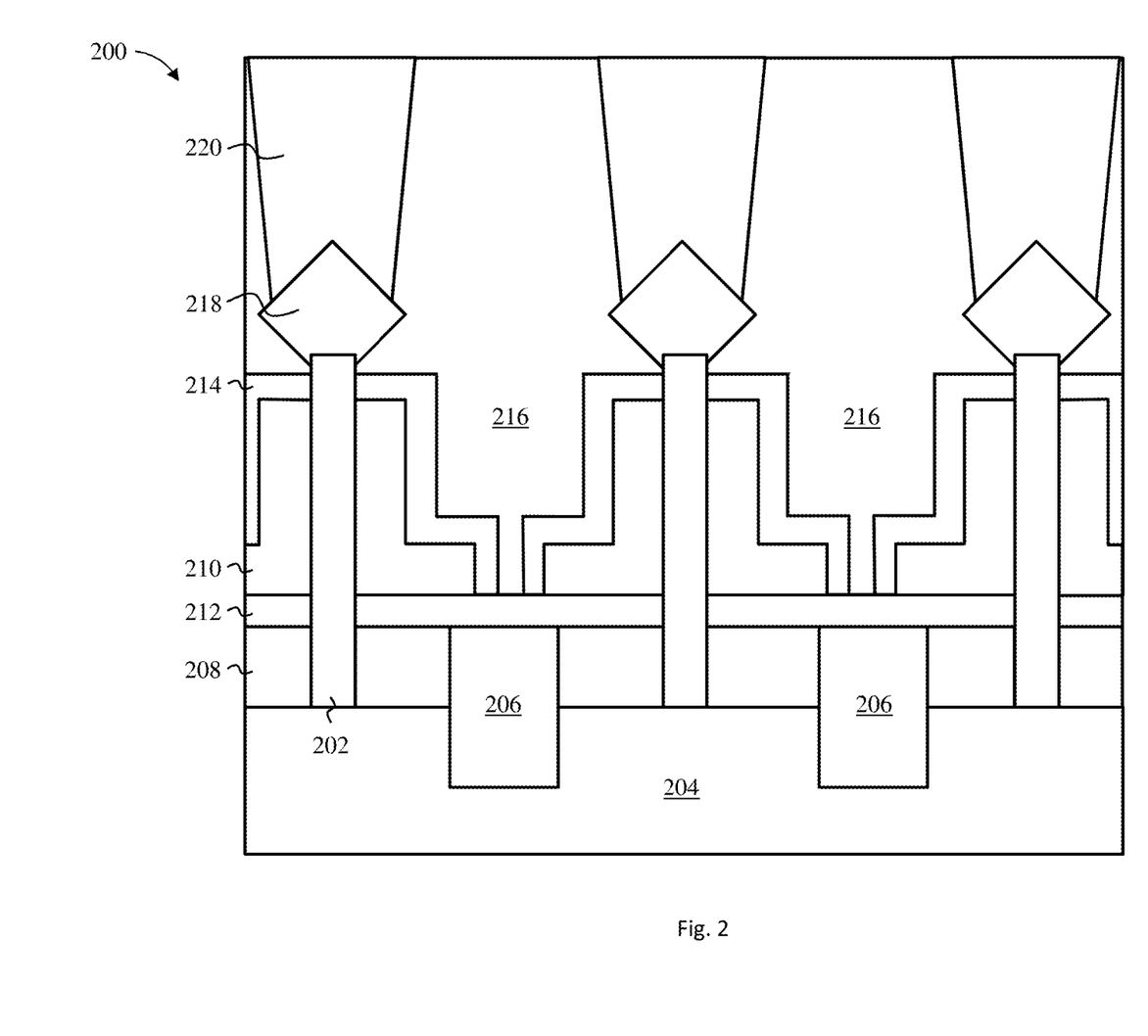
FIG. 2 depicts a cross-sectional view of a semiconductor structure after an initial set of processing operations according to one or more embodiments of the invention.

The one or more semiconductor fins 202 can be formed on the substrate 204 using known semiconductor fabrication techniques, including but not limited to, lithography followed by etching, sidewall image transfer (SIT), self-aligned double patterning (SADP), self-aligned multiple patterning (SAMP), and self-aligned quadruple patterning (SAQP). In some embodiments of the invention, a hard mask (not depicted) is patterned to expose portions of the substrate 204. The exposed portions of the substrate 204 can then be recessed to form the fins 202. The exposed portions of the substrate 204 can be removed using an etch process, which can be a wet etch process, a dry etch process or a combination thereof.

The semiconductor fins 202 can each have a height ranging from 15 nm to 150 nm. In some embodiments of the present invention, the semiconductor fins 202 are formed to a height of about 20 nm. Each of the semiconductor fins 202 can have a width ranging from 5 nm to 50 nm. The semiconductor fins 202 can be separated by a pitch (centerline-to-centerline distance) ranging from 10 nm to 100 nm. The semiconductor fins 202 can be doped with n-type dopants (e.g., As, P, Sb) or p-type dopants (e.g., B, Al, Ga), or can be intrinsically undoped (i.e., doping concentration less than $1\times10^{16}$ cm$^{-3}$) to form nFET semiconductor fins and pFET semiconductor fins, as desired. If the semiconductor fins 202 are doped, the dopant concentration can range from $1\times10^{16}$ cm$^{-3}$ to $2\times10^{21}$ cm$^{-3}$, or between $1\times10^{18}$ cm$^{-3}$ and $1\times10^{20}$ cm$^{3}$. In some embodiments of the invention, the semiconductor fins 202 are epitaxially grown on the substrate 204.

The semiconductor fins 202 can be made of any suitable material, such as, for example, silicon, silicon germanium, Group II-IV compound semiconductor, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 204 can be made of any suitable substrate material, such as, for example, silicon, silicon germanium, silicon carbide (SiC), Group III-V compound semiconductor, Group II-VI compound semiconductor, or semiconductor-on-insulator (SOI). For example, in embodiments where the semiconductor fins 202 are made of InGaAs, the substrate 204 can be made of InP. In some embodiments of the invention, the substrate 204 includes a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

In some embodiments of the invention, the semiconductor structure 200 can be electrically isolated from other regions of the substrate 204 by a shallow trench isolation region 206. The shallow trench isolation region 206 can be made of any suitable dielectric material, such as, for example, a low-k dielectric, a nitride, silicon nitride, silicon oxide, SiON, SiC, SiOCN, or SiBCN. In some embodiments of the invention, the shallow trench isolation region 206 includes silicon nitride or SiBCN.

As further depicted in FIG. 2, the semiconductor structure 200 can include a bottom source/drain (S/D) 208. In some embodiments of the invention, the bottom S/D 208 is formed by doping a top portion of the substrate 204. In some embodiments of the invention, the bottom S/D 208 is epitaxially grown on the substrate 204. Epitaxial semiconductor materials can be grown using, for example, vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. The bottom S/D 208 can include epitaxial semiconductor materials grown from gaseous or liquid precursors.

In some embodiments of the invention, the gas source for the deposition of epitaxial semiconductor material includes a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxial silicon and silicon germanium can be doped by adding n-type dopants (e.g., phosphorus or arsenic) or p-type dopants (e.g., Ga, B, $BF_2$, or Al). In some embodiments of the invention, the bottom S/D 208 can be epitaxially formed and doped by a variety of methods, such as, for example, in-situ doped epitaxy (doped during deposition), and/or doped following the epitaxy, for example, by ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

As further depicted in FIG. 2, the semiconductor structure 200 can include one or more gates 210. In some embodiments of the invention, the gates 210 can be high-k metal gates (HKMGs) formed using, for example, known replacement metal gate (RMG) processes, or so-called gate-first processes. The gates 210 can include high-k dielectric material(s) (e.g., a gate dielectric) and a work function metal stack (not shown). In some embodiments of the invention, the gates 210 further includes a main body formed from bulk conductive gate material(s).

In some embodiments of the invention, the gate dielectrics include a high-k dielectric film formed on a surface (sidewall or channel region) of the semiconductor fins 202. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 210 include one or more work function layers (sometimes referred to as a work function metal stack) formed between the high-k dielectric film and a bulk gate material. In some embodiments of the invention, the gates 210 include one or more work function layers, but do not include a bulk gate material.

The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 210 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments of the invention, a bulk gate conductive material is deposited over the work function layers. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

As further depicted in FIG. 2, a bottom spacer 212 can be formed over the shallow trench isolation region 206 and the bottom S/D 208. In some embodiments of the invention, the bottom spacer 212 is formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process. For example, spacer material can be directionally, conformally, or bulk deposited over the semiconductor structure 200 or between the gates 210 and the bottom S/D 208.

In some embodiments of the invention, the bottom spacer 212 is conformally formed using CVD or ALD. The bottom spacer 212 can be made of any suitable material, such as, for example, a low-k dielectric, a nitride, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). The bottom spacer 212 can be formed to a thickness of about 5 to 10 nm, although other thicknesses are within the contemplated scope of the invention.

As further depicted in FIG. 2, a top spacer 214 can be formed over the semiconductor structure 200. The top spacer 214 can be formed or deposited using any suitable method, such as, for example, CVD, PECVD, UHVCVD, RTCVD, MOCVD, LPCVD, LRPCVD, ALD, PVD, chemical solution deposition, or other like process. In some embodiments of the invention, the top spacer 214 is conformally deposited over sidewalls of the gates 210 and a surface of the bottom spacer 212 using, for example, ALD, although other conformal deposition processes are within the contemplated scope of the invention. The top spacer 214 can be made of any suitable material, such as, for example, a low-k dielectric, a nitride, silicon nitride, SiON, SiC, SiOCN, or SiBCN. In some embodiments of the invention, the top spacer 214 includes a carbon doped silicon (SiC). The top spacer 214 can be formed to a nominal (conformal) thickness of about 5 nm or less, or 3 nm or less, although other thicknesses are within the contemplated scope of the invention.

As further depicted in FIG. 2, an interlayer dielectric 216 can be formed over the semiconductor structure 200 between adjacent gates of the gates 210. The interlayer dielectric 216 serves as an isolation structure for the semiconductor fins 202. The interlayer dielectric 216 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 216 can be utilized, such as, for example, CVD, PECVD, ALD, flowable CVD, spin-on dielectrics, or PVD.

As further depicted in FIG. 2, a top S/D 218 can be formed on the semiconductor fins 202. In some embodiments of the invention, the top S/D 218 is epitaxially grown from exposed surfaces of the semiconductor fins 202. Epitaxial semiconductor materials can be grown using, for example, VPE, MBE, LPE, or other suitable processes, including gaseous or liquid precursors, in a similar manner as the bottom S/D 208.

The top S/D 218 can be doped by adding n-type dopants (e.g., phosphorus or arsenic) or p-type dopants (e.g., Ga, B, $BF_2$, or Al) in a similar manner as the bottom S/D 208. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

As further depicted in FIG. 2, a top contact 220 can be formed by depositing or forming a conductive material on a surface of the top S/D 218. The top contact 220 can be formed or deposited using known metallization techniques. In some embodiments of the invention, a trench is formed in the interlayer dielectric 216 and the trench is filled with conductive material. In some embodiments of the invention, the top contact 220 is overfilled above a surface of the trench, forming an overburden that is removed using, for example, CMP. While not shown for ease of illustration, additional contacts (e.g., bottom S/D contacts and gate contacts) can be formed in the semiconductor structure 200 using known VFET fabrication workflows.

The top contact 220 (and any other contacts) can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the top contact 220 is a cobalt or tungsten contact. The conductive material can further include dopants that are incorporated during or after deposition. In some embodiments of the invention, the top contact 220 can include a barrier metal liner (not depicted). Material examples include tantalum nitride and tantalum (TaN/Ta), titanium, titanium nitride, cobalt, ruthenium, and manganese.

Figure 3:
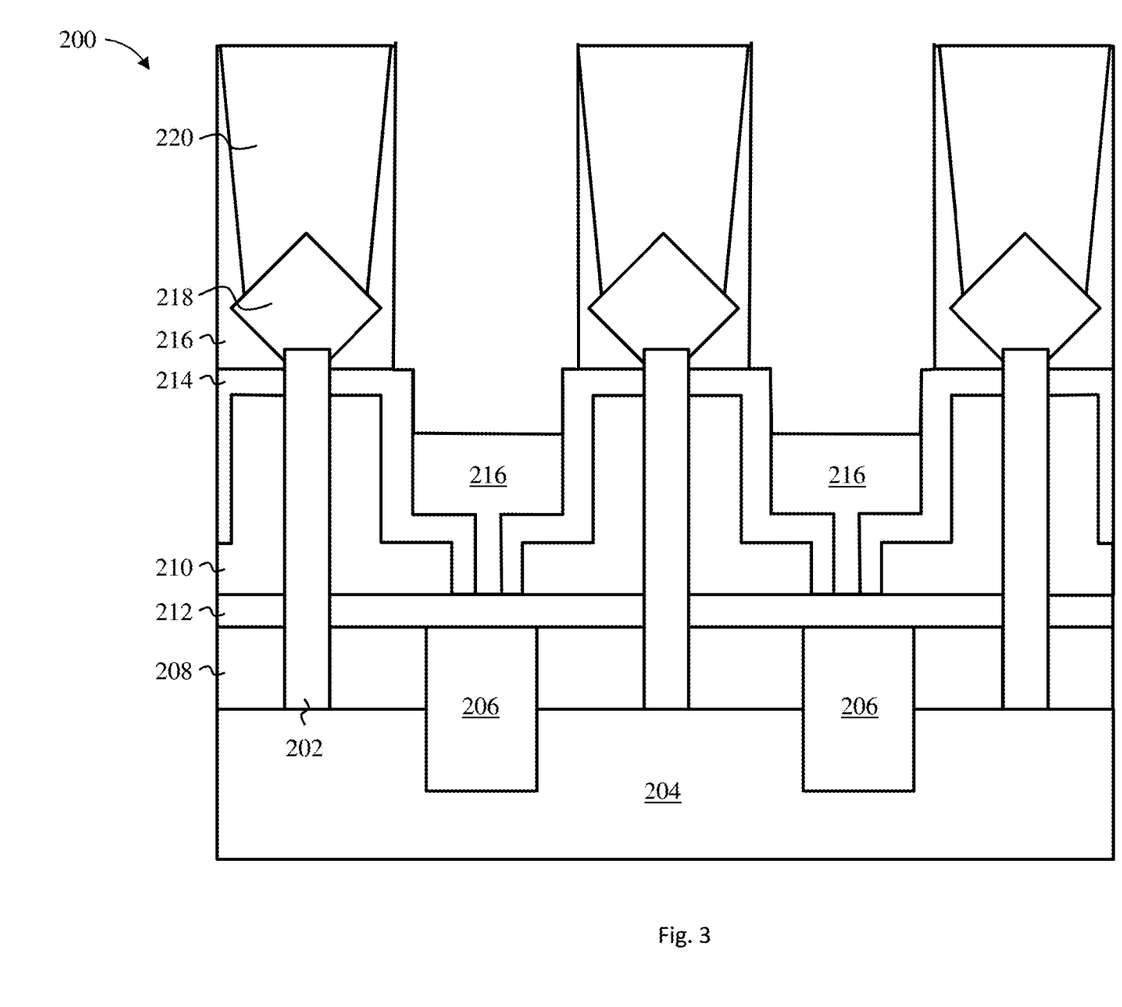
FIG. 3 depicts a cross-sectional view of the semiconductor structure after additional processing operations according to one or more embodiments of the invention.

FIG. 3 depicts a cross-sectional view of the semiconductor structure 200 after a processing operation according to one or more embodiments of the invention. As illustrated in FIG. 3, a portion of the interlayer dielectric 216 is recessed to expose a top surface and sidewalls of the top spacer 214. The interlayer dielectric 216 can be recessed using an etch process, which can be a wet etch process, a dry etch process or a combination thereof. In some embodiments of the invention, the interlayer dielectric 216 is recessed using a directional etch. For example, the interlayer dielectric 216 can be recessed using a RIE. In some embodiments of the invention, the RIE partially removes portions of the interlayer dielectric 216 below a top surface of the top spacer 214.

Figure 4:
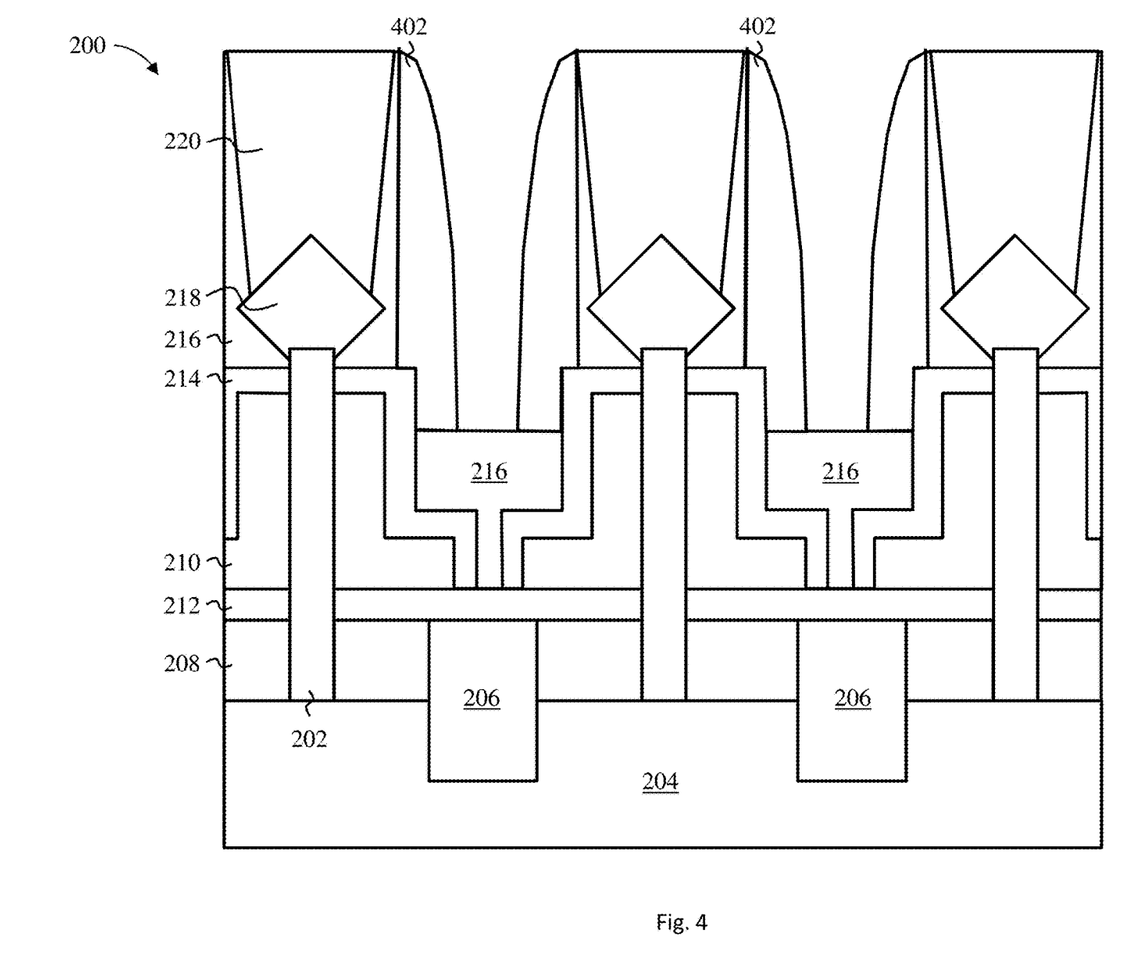
FIG. 4 depicts a cross-sectional view of the semiconductor structure after additional processing operations according to one or more embodiments of the invention.

FIG. 4 depicts a cross-sectional view of the semiconductor structure 200 after a processing operation according to one or more embodiments of the invention. As illustrated in FIG. 4, a dielectric collar 402 is formed on a recessed surface of the interlayer dielectric 216, on sidewalls of the interlayer dielectric 216, and on exposed portions (a top surface and sidewall) of the top spacer 214. The dielectric collar 402 serves to glue the top S/D 218 and the top contact 220 to the rest of the semiconductor structure 200 (e.g., the top spacer 214, the gates 210, the substrate 204, etc.).

The dielectric collar 402 can be formed or deposited using any suitable method, such as, for example, CVD, PECVD, UHVCVD, RTCVD, MOCVD, LPCVD, LRPCVD, ALD, PVD, chemical solution deposition, or other like process. In some embodiments of the invention, the dielectric collar 402 is formed by conformal dielectric deposition followed by a RIE etch back. For example, a dielectric material can be conformally deposited over the semiconductor structure 200 using, for example, ALD, although other conformal deposition processes are within the contemplated scope of the invention. The dielectric material can then be removed from horizontal surfaces of the semiconductor structure 200 using a RIE etch back. In this manner, the remaining dielectric material on vertical sidewalls of the semiconductor structure 200 define the dielectric collar 402.

The dielectric collar 402 can be made of any suitable material, such as, for example, a low-k dielectric, a nitride, silicon nitride, SiON, SiC, SiOCN, or SiBCN. In some embodiments of the invention, the dielectric collar 402 includes SiOCN or SiBCN. The dielectric collar 402 can be formed to a nominal (conformal) thickness of about 10 nm or less, or 5 nm or less, although other thicknesses are within the contemplated scope of the invention.

Figure 5:
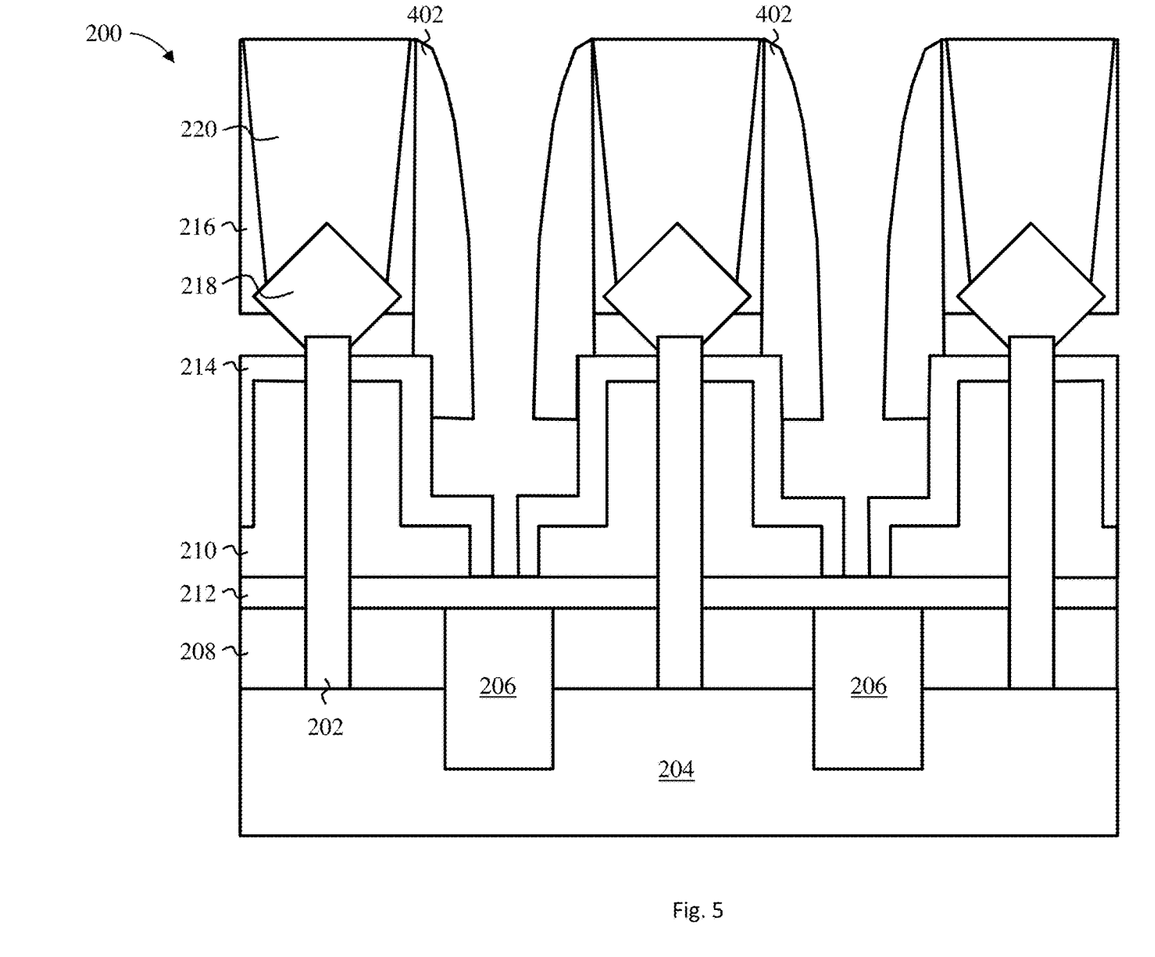
FIG. 5 depicts a cross-sectional view of the semiconductor structure after additional processing operations according to one or more embodiments of the invention.

FIG. 5 depicts a cross-sectional view of the semiconductor structure 200 after a processing operation according to one or more embodiments of the invention. As illustrated in FIG. 5, a first portion and a second portion of the interlayer dielectric 216 are removed. Removing the first portion of the interlayer dielectric 216 exposes a surface of the bottom spacer 212. Removing the second portion of the interlayer dielectric 216 exposes a surface of the top S/D 218 and a top surface of the top spacer 214. In some embodiments of the invention, removing the second portion of the interlayer dielectric 216 also exposes a sidewall of the fins 202.

The first portion and the second portion of the interlayer dielectric 216 can be recessed using an etch process, which can be a wet etch process, a dry etch process or a combination thereof. In some embodiments of the invention, the first portion and the second portion of the interlayer dielectric 216 are removed using an isotropic etch (nondirectional etch). In some embodiments of the invention, the first portion and the second portion of the interlayer dielectric 216 are removed selective to the bottom spacer 212 and/or the top spacer 214. For example, the first portion and the second portion of the interlayer dielectric 216 can be selectively removed via exposure to known selective etch chemistries, such as fluorine, chlorine, and bromine-based low-pressure plasmas, or an aqueous solution containing hydrofluoric acid (HF). Other suitable isotropic etch processes such as chemical oxide removal can also be used.

As discussed previously herein, the dielectric collar 402 anchors the top S/D 218 and the top contact 220 to the rest of the semiconductor structure 200 (e.g., the top spacer 214, the gates 210, the substrate 204, etc.) after the first portion and the second portion of the interlayer dielectric 216 are removed.

Figure 6:
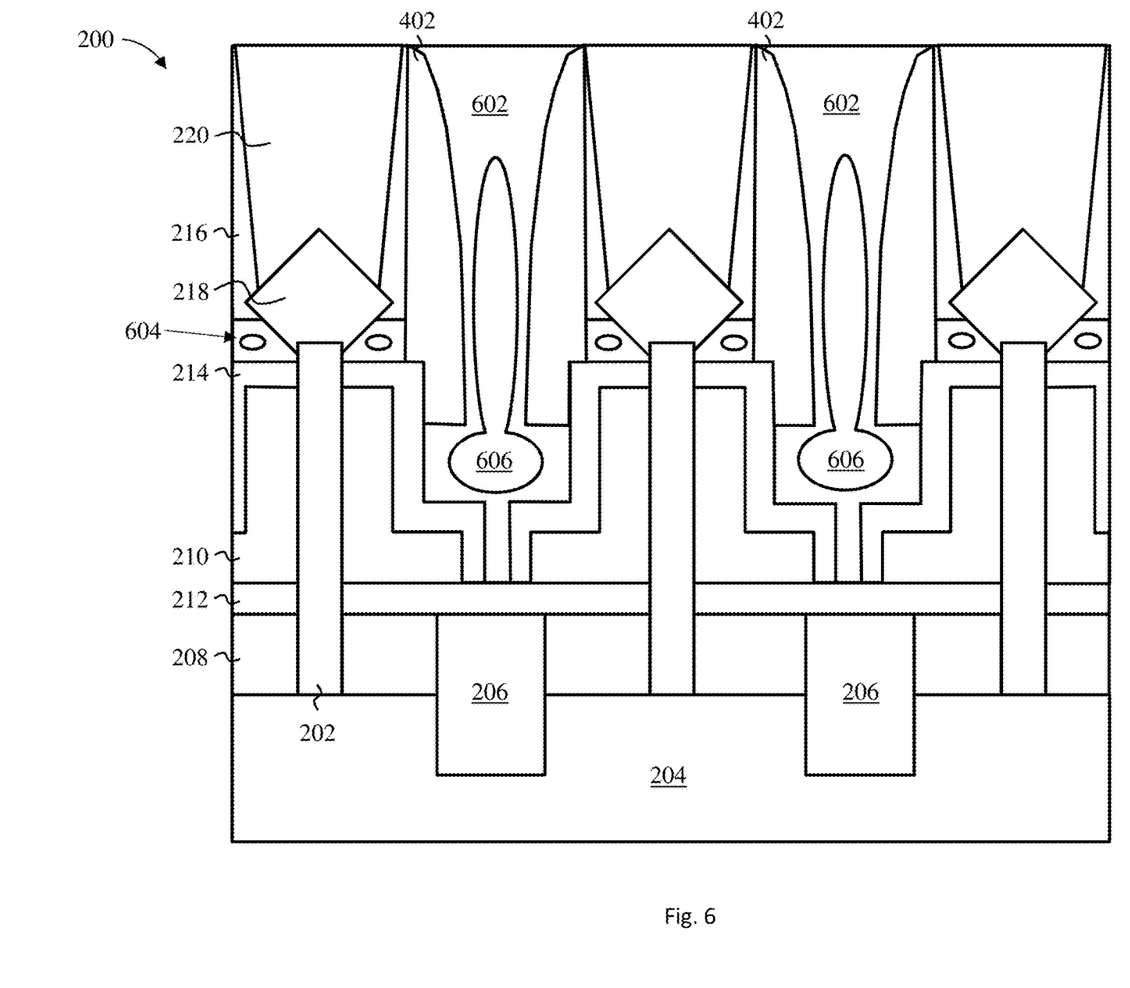
FIG. 6 depicts a cross-sectional view of the semiconductor structure after additional processing operations according to one or more embodiments of the invention.

FIG. 6 depicts a cross-sectional view of the semiconductor structure 200 after a processing operation according to one or more embodiments of the invention. As illustrated in FIG. 6, a dielectric layer 602 can be deposited or formed over the semiconductor structure 200. The dielectric layer 602 can be made of any suitable dielectric material, such as, for example, porous silicates, carbon doped oxides, silicon dioxides, silicon nitrides, silicon oxynitrides, silicon carbide (SiC), an ultra-low-k material, or other dielectric materials. Example ultra-low-k dielectric materials can include, for example, porous organosilicate glass (OSG), carbon-doped oxide (CDO), porous silicon dioxide, spin-on organic polymeric dielectrics (e.g., polyimide, polynorbornenes, benzocyclobutene, and polytetrafluoroethylene (PTFE)), hydrogen silsesquioxane (HSQ), and methylsilsesquioxane (MSQ).

Any known manner of forming the dielectric layer 602 can be utilized, such as, for example, CVD, PECVD, ALD, flowable CVD, spin-on dielectrics, or PVD. In some embodiments of the invention, the dielectric layer 602 is non-conformally deposited over the semiconductor structure 200 to form a first airgap 604 between the top contact 220 and the top spacer 214, and a second airgap 606 between opposite sidewalls of the dielectric collar 402. As discussed previously herein, after forming the dielectric collar 402, forming the airgaps 604 and 606 can be done without inducing a collapse of the semiconductor structure 200.

Figure 7:
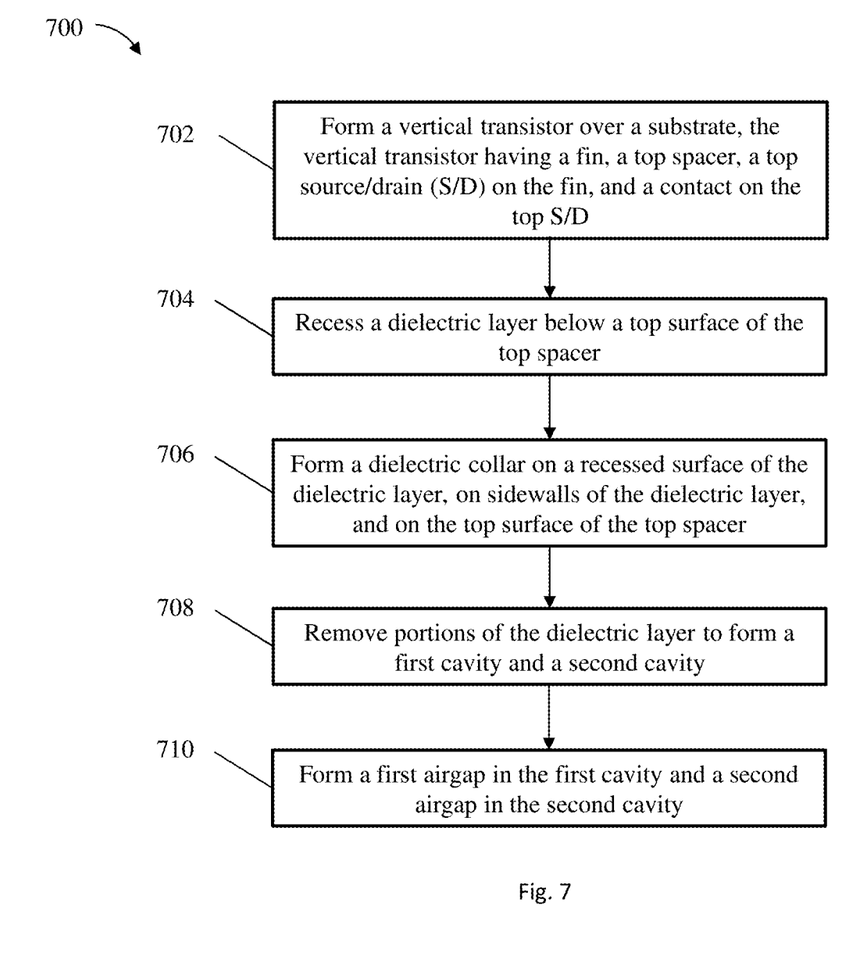
FIG. 7 depicts a flow diagram illustrating a method according to one or more embodiments of the invention.

FIG. 7 depicts a flow diagram 700 illustrating a method for forming a semiconductor device according to one or more embodiments of the invention. As shown at block 702, a vertical transistor is formed over a substrate. The vertical transistor can include a fin, a top spacer, a top S/D on the fin, and a contact on the top S/D. At block 704, a dielectric layer is recessed below a top surface of the top spacer. In some embodiments of the invention, recessing the dielectric layer includes a directional RIE. In some embodiments of the invention, the directional RIE exposes the top surface and sidewalls of the top spacer.

At block 706, a dielectric collar is formed on a recessed surface of the dielectric layer, on sidewalls of the dielectric layer, and on the top surface of the top spacer. At block 708, portions of the dielectric layer are removed to form a first cavity and a second cavity. In some embodiments of the invention, the first cavity is positioned between the contact and the top spacer. In some embodiments of the invention, the second cavity is positioned between opposite sidewalls of the dielectric collar.

In some embodiments of the invention, removing portions of the dielectric layer includes an isotropic etch. In some embodiments of the invention, a first portion and a second portion of the dielectric layer are selectively removed. In some embodiments of the invention, the first portion and the second portion of the dielectric layer are removed selective to a bottom spacer of the vertical transistor, the top spacer, or both the bottom spacer and the top spacer. In some embodiments of the invention, selectively removing the first portion exposes a surface of the bottom spacer. In some embodiments of the invention, selectively removing the second portion exposes a surface of the top S/D and the top surface of the top spacer. In some embodiments of the invention, selectively removing the second portion also exposes a sidewall of the fin.

At block 710, a first airgap is formed in the first cavity and a second airgap is formed in the second cavity. The dielectric collar anchors the top S/D to the top spacer so that formation of the first airgap and the second airgap does not cause a structural collapse of the semiconductor device. In some embodiments of the invention, forming the first airgap and the second airgap includes a non-conformal dielectric deposition.

Figure 8:
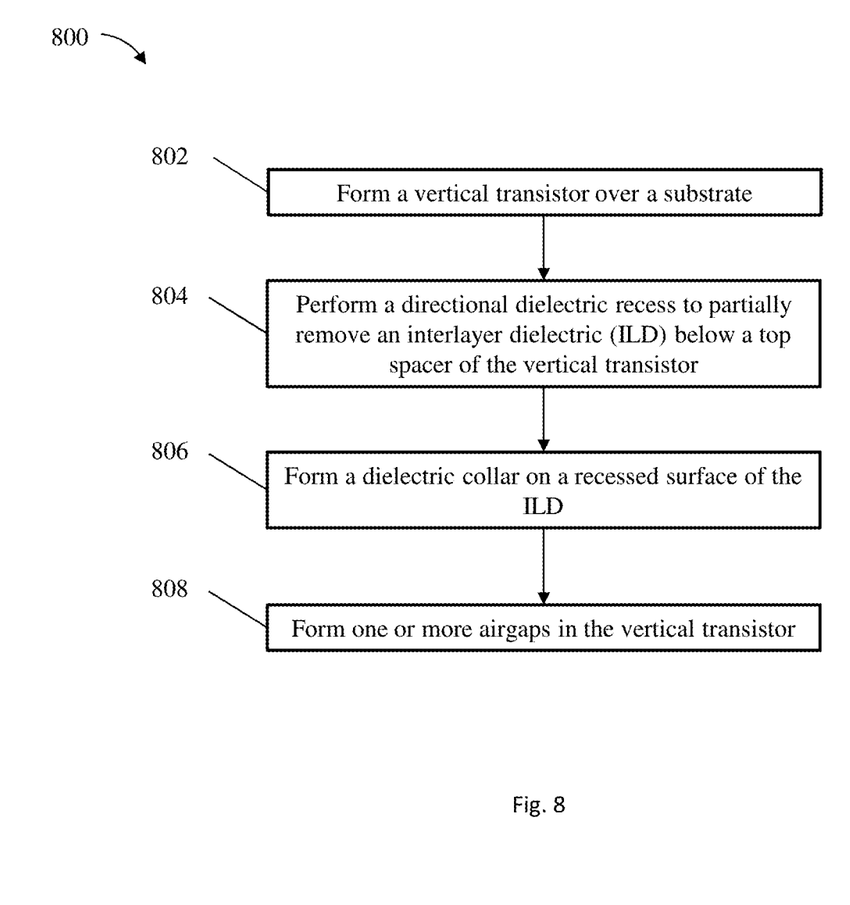
FIG. 8 depicts a flow diagram illustrating a method according to one or more embodiments of the invention.

FIG. 8 depicts a flow diagram 800 illustrating a method for forming a semiconductor device according to one or more embodiments of the invention. As shown at block 802, a vertical transistor is formed over a substrate. The vertical transistor can include a fin, a top spacer, a top S/D on the fin, and a contact on the top S/D. At block 804, a directional dielectric recess partially removes an ILD below the top spacer of the vertical transistor.

At block 806, a dielectric collar is formed on a recessed surface of the ILD. At block 808, one or more airgaps are formed in the vertical transistor. In some embodiments of the invention, the dielectric collar anchors portions of the vertical transistor while forming the one or more airgaps. In some embodiments of the invention, forming the one or more airgaps includes a non-conformal dielectric deposition over the top spacer.

The method can further include performing an isotropic etch to form a first cavity and a second cavity in the vertical transistor. The first cavity can be positioned between a contact and the top spacer. The second cavity can be positioned between opposite sidewalls of the dielectric collar.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a vertical transistor over a substrate, the vertical transistor comprising a fin, a top spacer, a top source/drain (S/D) on the fin, and a contact on the top S/D;
    recessing a dielectric layer below a top surface of the top spacer;
    forming a dielectric collar on a recessed surface of the dielectric layer, on sidewalls of the dielectric layer, and on the top surface of the top spacer;
    removing portions of the dielectric layer to form a first cavity and a second cavity, the first cavity between the contact and the top spacer, the second cavity between opposite sidewalls of the dielectric collar, the dielectric collar anchoring the top S/D to the top spacer; and
    forming a first airgap in the first cavity and a second airgap in the second cavity.

2. The method of claim 1, wherein recessing the dielectric layer comprises a directional reactive ion etch (RIE).

3. The method of claim 2, wherein the directional RIE exposes the top surface and sidewalls of the top spacer.

4. The method of claim 1, wherein removing portions of the dielectric layer comprises an isotropic etch.

5. The method of claim 4, wherein removing portions of the dielectric layer further comprises selectively removing a first portion and a second portion of the dielectric layer.

6. The method of claim 5, wherein the first portion and the second portion of the dielectric layer are removed selective to a bottom spacer of the vertical transistor, the top spacer, or both the bottom spacer and the top spacer.

7. The method of claim 6, wherein selectively removing the first portion exposes a surface of the bottom spacer.

8. The method of claim 6, wherein selectively removing the second portion exposes a surface of the top S/D and the top surface of the top spacer.

9. The method of claim 8, wherein selectively removing the second portion also exposes a sidewall of the fin.

10. The method of claim 1, wherein forming the first airgap and the second airgap comprises a non-conformal dielectric deposition.

11. A method for forming a semiconductor device, the method comprising:
  forming a vertical transistor over a substrate;
  performing a directional dielectric recess to partially remove an interlayer dielectric (ILD) below a top spacer of the vertical transistor;
  forming a dielectric collar on a recessed surface of the ILD; and
  forming one or more airgaps in the vertical transistor;
  wherein the dielectric collar anchors portions of the vertical transistor while forming the one or more airgaps.

12. The method of claim 11, wherein forming the one or more airgaps comprises a non-conformal dielectric deposition over the top spacer.

13. The method of claim 11 further comprising performing an isotropic etch to form a first cavity and a second cavity in the vertical transistor, the first cavity between a contact and the top spacer, the second cavity between opposite sidewalls of the dielectric collar.

14. The method of claim 13, wherein forming the first cavity and the second cavity comprises selectively removing a first portion and a second portion of the ILD.

15. The method of claim 14, wherein the first portion and the second portion of the ILD are removed selective to a bottom spacer of the vertical transistor, the top spacer, or both the bottom spacer and the top spacer.

* * * * *